US012765009B2

(12) United States Patent
Lin

(10) Patent No.: US 12,765,009 B2
(45) Date of Patent: Oct. 13, 2026

(54) SEMICONDUCTOR STRUCTURE WITH CURVED SURFACES

(71) Applicant: Micron Technology, Inc., Boise, ID (US)

(72) Inventor: Yenting Lin, Boise, ID (US)

(73) Assignee: Micron Technology, Inc., Boise, ID (US)

(*) Notice: Subject to any disclaimer, the term of this patent is extended or adjusted under 35 U.S.C. 154(b) by 370 days.

(21) Appl. No.: 18/500,254

(22) Filed: Nov. 2, 2023

(65) Prior Publication Data

US 2024/0178272 A1 May 30, 2024

Related U.S. Application Data

(60) Provisional application No. 63/428,894, filed on Nov. 30, 2022.

(51) Int. Cl.

| | |
|---|---|
| ***H10B 12/00*** | (2023.01) |
| ***H10D 62/10*** | (2025.01) |
| ***H10P 14/20*** | (2026.01) |
| ***H10P 50/00*** | (2026.01) |
| ***H10W 20/00*** | (2026.01) |

(52) U.S. Cl.

CPC ....... *H10D 62/117* (2025.01); *H10P 14/3406* (2026.01); *H10P 50/692* (2026.01); *H10W 20/056* (2026.01); *H10W 20/089* (2026.01)

(58) Field of Classification Search

CPC .................................................... H10B 12/315

See application file for complete search history.

(56) References Cited

U.S. PATENT DOCUMENTS

| | | | | |
|---|---|---|---|---|
| 9,761,559 B1 | 9/2017 | Shih | | |
| 2018/0005984 A1 | 1/2018 | Yu | | |
| 2022/0139885 A1 | 5/2022 | Hu | | |
| 2023/0317665 A1 | 10/2023 | Pan | | |
| 2024/0064968 A1* | 2/2024 | Choi | .................... | H10B 12/482 |
| 2024/0324182 A1* | 9/2024 | Cho | ..................... | H10B 12/482 |

* cited by examiner

*Primary Examiner* — Christopher A Johnson

(74) *Attorney, Agent, or Firm* — Brooks, Cameron & Huebsch, PLLC

(57) ABSTRACT

Methods, apparatuses, and systems related to semiconductor structure with curved surfaces are described. An example apparatus includes a semiconductor structure comprising a patterned material comprising active areas, a first conductive material on a surface of each active area, and a first metal material on a surface of each first conductive material. The patterned material further includes a second and third conductive material, a first nitride material, and a second nitride material separating each active area, first conductive material, and first metal material from each second and third conductive material, and first nitride material. The apparatus includes a curved surface formed on a portion of the first metal material and second nitride material. The apparatus further includes a first layer comprising an oxide material and a second metal material on the patterned material, where the oxide material contacts the curved surface.

9 Claims, 10 Drawing Sheets

SEMICONDUCTOR STRUCTURE WITH CURVED SURFACES

PRIORITY INFORMATION

This application claims the benefit of U.S. Provisional Application No. 63/428,894, filed on Nov. 30, 2022, the contents of which are incorporated herein by reference.

TECHNICAL FIELD

The present disclosure relates generally to semiconductor devices and methods, and more particularly to a semiconductor structure with curved surfaces.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1A:
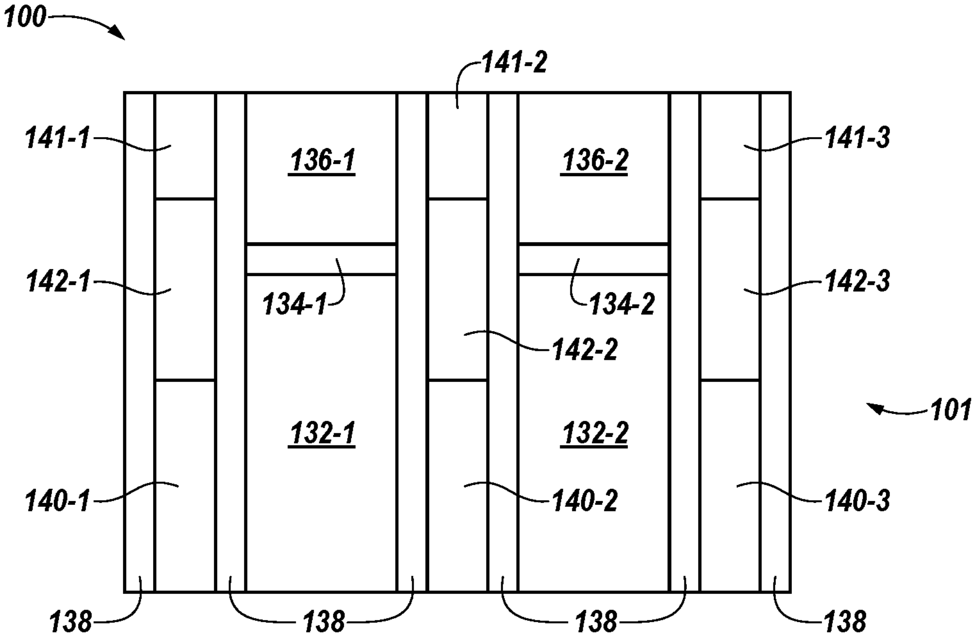
FIGS. 1A-5 illustrate cross-sectional views of a portion of a semiconductor structure of a memory device in association with a semiconductor fabrication sequence formation of a semiconductor structure in accordance with a number of embodiments of the present disclosure.

The present disclosure includes apparatuses, methods, and systems for semiconductor structures with a curved indentation. The semiconductor structures with a curved indentation can be formed via a redistribution layer (RDL) reverse damascene flow. The RDL reverse damascene flow can be used for an RDL layer. The RDL layer can be formed on and enclosing a first surface of the semiconductor die and thereby form the semiconductor structures with the curved surfaces.

Various materials may be deposited using techniques such as chemical vapor deposition (CVD), plasma deposition, etc. The deposited materials can be patterned using techniques such photolithographic techniques and/or doping techniques and/or can be etched using wet and/or dry etch (e.g., vapor) processes to form semiconductor structures. Such semiconductor structures may contain, or be associated with, various materials that contribute to data access, storage, and/or processing, or to various support structures, on the memory device. As an example, a capacitor material may be deposited into an opening in a semiconductor structure to permit data access, storage, and/or processing use of the semiconductor structure including the capacitor material.

Semiconductor support structures are typically formed with spacers and sacrificial materials. Openings may be formed through the semiconductor support structure to create spacers for storage node and capacitor material. In some previous approaches, the metal material used to create the spacer may not be further etched to create a larger space. This may result in limited space for the storage node and/or capacitor material. Having inadequate space for the storage node and/or capacitor material could result in poor quality memory devices by reducing the functionality of the capacitor, etc.

In contrast, in order to mitigate this issue, a method for semiconductor structure with curved surfaces described further below. As an example, a curved surface may be formed in the first insulative material to increase the spacer area formed in the semiconductor structure. This can be accomplished by using an RDL reverse damascene process to enlarge the area of the spacer by creating a curved surface in the first metal material and alternating first insulative material adjacent the first metal material. Stated differently, the RDL reverse damascene process can form a curved interface between the first metal material and a first material adjacent to the first metal material. For example, a portion of the first metal material can be removed (e.g., etched) to create a rounded/curved surface on the first metal material. The rounded/curved surface can continue into a portion of the adjacent first insulative material. Thereby, creating a surface that curves into a portion of the first metal material and a portion of the first insulative material. The presence of the curved interface to provide a larger surface area and/or increased dimension for contact between adjacent materials. For instance, as detailed herein, the curved surface can have a width that is greater than 8.0 nanometers (nm), etc. As such, approaches herein with curved interfaces can increase the area within the semiconductor structure for depositing capacitors, access nodes, etc. That is, semiconductor structures with smaller surface areas (e.g., surfaces areas of 8.0 nm or less) can lead to electrical shorts if the capacitor is not properly placed. However, embodiments described herein provide a larger surface area (e.g., surfaces areas of greater than 8.0 nm) by forming a curved surface to reduce and/or eliminate the amount of electrical shorts in the semiconductor structure, as compared to other approaches such as those which do not employ curved interfaces.

The present disclosure includes methods, apparatuses, and systems related to semiconductor structure with curved surfaces. An example semiconductor structure including a pattern materials including a plurality of active areas, a first conductive material on a surface of each of the active areas, and a first metal material on a surface of each of the first conductive materials. The pattern materials also include a second conductive material, a conductive material, a fourth nitride material, and a first insulative material separating each of the active areas, first conductive material, and first metal material from each of the second conductive material, the conductive material, and the fourth nitride material. The semiconductor structure further includes a curved surface including a portion of a first side of the first metal material and a portion of the alternating first insulative material adjacent the first metal material, and a second insulative material and a second metal material on the surface of the patterned material, where a portion of the second insulative material is in contact with the curved surface. In some embodiments, the second insulative material is different the first insulative.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 103 may reference element "03" in FIG. 1A, and a similar element may be referenced as 203 in FIG. 2A. In some instances, a plurality of similar, but functionally and/or structurally distinguishable, elements or components in the same figure or in different figures may be referenced sequentially with the same element number (e.g., 103-1, 103-2, 103-3 in FIG. 1A).

FIG. 1A illustrates a cross-sectional view of a portion of a semiconductor structure 100 of a memory device in association with a semiconductor fabrication sequence formation of a semiconductor structure in accordance with a number of embodiments of the present disclosure. The example pattern of materials 101 is shown to have been formed as a part of a redistribution layer (RDL). The RDL may electrically connect one part of a semiconductor package to another. Each of the pattern of materials 101 may include active areas 132 (individually referring to active area 132-1 and active area 132-2), a first conductive material 134 (individually referring to first conductive material 134-1 and first conductive material 134-2) on the surface of the active areas 132, and a first metal material 136 (individually referring to first metal material 136-1 and first metal material 136-2) on the surface of the first conductive material 134. The active areas 132 can be a silicon based active area. The first conductive material 134 may be a cobalt monosilicide (CoSi) material. The first metal material 136 may be tungsten (W), titanium (Ti), or a tungsten titanium polymer, among other possibilities.

Each pattern materials 101 may also include a second conductive material 140 (individually referring to second conductive material 140-1, second conductive material 140-2, and second conductive material 140-3), a first dielectric material 141 (individually referring to first dielectric material 141-1, first dielectric material 141-2, and first dielectric material 141-3), a third conductive material 142 (individually referring to third conductive material 142-1, third conductive material 142-2, and third conductive material 142-3) separating the second conductive material 140 and the first dielectric material 141, and a plurality of first insulative material 138 separating each active area 132, each first conductive material 134, and each first metal material 136, from each second conductive material 140, first dielectric material 141, and third conductive material 142. In some embodiments, the second conductive material 140 may be deposited on the first side of the third conductive material 142 and the first dielectric material 141 on the second side of the third conductive material 142 to form a stacked layer. In some embodiments, a plurality of first insulative material 138 can separate a plurality of stacked layers from each active area 132, each first conductive material 134, and each first metal material 136. The third conductive material 142 may serve as a digit line, the first metal material 136 may serve as a gate material, active areas 132 may serve as a source/drain region, while the second conductive material 140 may serve as an isolation material for the pattern materials 101. In some embodiments, the first dielectric material may be a nitride material. In some embodiments, the second conductive material 140 may be formed from tungsten (W), titanium (Ti), or a tungsten titanium polymer, among other possibilities. Third conductive material 142 may be a metal material. For example, third conductive material 142 may be a tungsten (W) material or a titanium nitride (TiN) material. The first insulative material 138 may a nitride material. For example, the first insulative may be a titanium nitride (TiN) based material. In some embodiments, the first metal material 136 may be tungsten (W), titanium (Ti), or a tungsten titanium polymer, among other possibilities.

As used herein, the term "dielectric material" refers to and includes electrically insulative materials. Dielectric material, as discussed herein, may include, but is not limited to, one or more insulative oxide material or an insulative nitride material. A dielectric oxide may be an oxide material, a metal oxide material, or a combination thereof. The dielectric material may include, but is not limited to, a silicon oxide (SiOx), doped SiOx, phosphosilicate glass, borosilicate glass, borophosphosilicate glass, fluorosilicate glass, tetraethylorthosilicate (TEOS), silica carbon nitride (SiCN), silicon oxynitride (SiON), zirconium oxide carboxynitride material (e.g., SiOxCzNy), a combination thereof or a combination of one or more of the listed materials with silicon oxide.

Figure 1B:
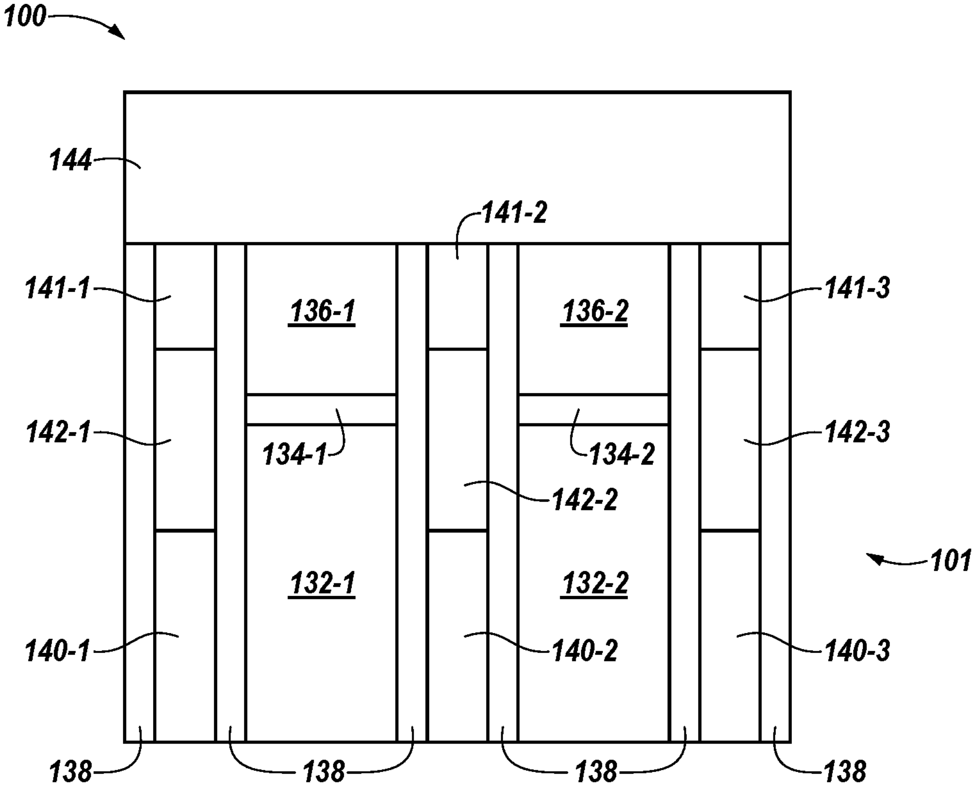

FIG. 1B illustrates a cross-sectional view of a portion of a semiconductor structure 100 of a memory device in association with a semiconductor fabrication sequence formation of a semiconductor structure in accordance with a number of embodiments of the present disclosure. FIG. 1B illustrates the example semiconductor structure at a particular stage following completion of the example fabrication sequence described in connection with FIG. 1A.

As illustrated in FIG. 1B, a carbon-based material 144 may be formed on the pattern of materials 101. The first layer may be deposited according to a semiconductor fabrication process such as chemical vapor deposition (CVD), plasma deposition, atomic layer deposition (ALD), etc. Embodiments, however, are not limited to these example and other suitable semiconductor fabrication techniques may be used to form the carbon-based material 144. The carbon-based material 144 may cover a first side of the pattern of materials 101. In one embodiment, carbon-based material 144 may be deposited to have a thickness in a range of twenty (30) nanometers (nm) to sixty (60) nm. Embodiments, however, are not limited to these examples.

Figure 1C:
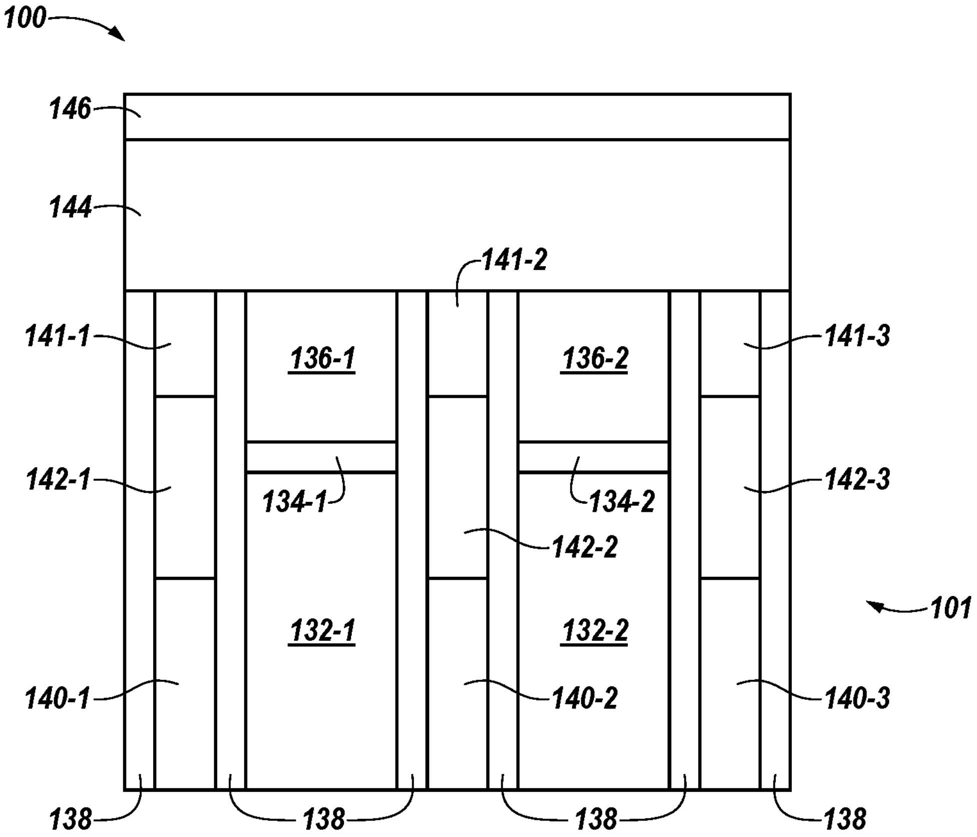

FIG. 1C illustrates a cross-sectional view of a portion of a semiconductor structure 100 of a memory device in association with a semiconductor fabrication sequence formation of a semiconductor structure in accordance with a number of embodiments of the present disclosure. FIG. 1C illustrates the example semiconductor structure at a particular stage following completion of the example fabrication sequence described in connection with FIG. 1B.

A photolithographic hard mask (HM) layer 146 may be formed on the carbon-based material 144 formed on the pattern of materials 101. The hard mask layer 146 may be deposited using CVD and planarized using CMP to cover the carbon-based material 144. In some embodiments, the photolithographic mask, e.g., hard mask layer 146 may be formed using photolithographic techniques. In one embodiment, the hard mask layer 146 may be deposited over the carbon-based material 144. Similar semiconductor process techniques may be used at other points of the semiconductor fabrication process described herein.

Figure 2A:
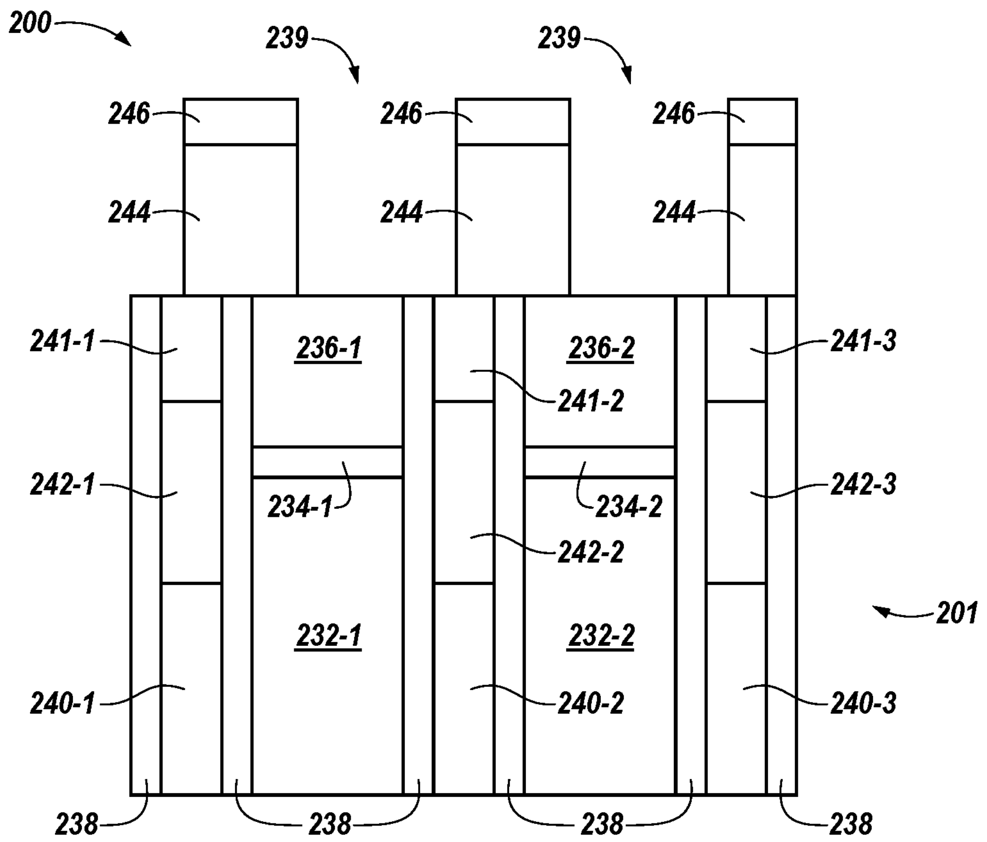

FIG. 2A illustrates a cross-sectional view of a portion of a semiconductor structure 200 of a memory device in association with a semiconductor fabrication sequence formation of a semiconductor structure in accordance with a number of embodiments of the present disclosure. FIG. 2A illustrates the example semiconductor structure at a particular stage following completion of the example fabrication sequence described in connection with FIGS. 1A-1C.

The semiconductor structure 200 may include the same or similar elements as the example semiconductor structure 100 as referenced in FIG. 1C. For example, the pattern of materials 201 is analogous or similar to pattern of materials 101. Active areas 232 (individually referring to active area 232-1 and active area 232-2) may be analogous or similar to silicon active areas 132. First conductive material 234 (individually referring to first conductive material 234-1 and first conductive material 234-2) may be analogous or similar to first conductive material 134. First metal material 236 (individually referring to first metal material 236-1 and first metal material 236-2) may be analogous or similar to first metal material 136. Second conductive material 240 (individually referring to second conductive material 240-1 and second conductive material 240-2, and second conductive material 240-3) may be analogous or similar to second conductive material 140. First dielectric material 241 (individually referring to first dielectric material 241-1 and first dielectric material 241-2, and first dielectric material 241-3) may be analogous or similar to first dielectric material 141. Third conductive material 242 (individually referring to conductive 242-1, third conductive material 242-2, and third conductive material 242-3) may be analogous or similar to third conductive material 142. First insulative material 238 may be analogous or similar to first insulative material 138.

In the example embodiment shown in the example of FIG. 2A, the method comprises using an etchant process to form a plurality of first vertical openings 239 through the carbon-based material 244 and the hard mask 246. In one example, as shown in FIG. 2A, the plurality of first vertical openings 239 may form elongated vertical, pillar like columns of the carbon-based material 244 and hard mask 246. The plurality of first vertical openings 239 may be formed using an etchant process to expose the sidewalls of the carbon-based material 244 and the hard mask 246.

Figure 2B:
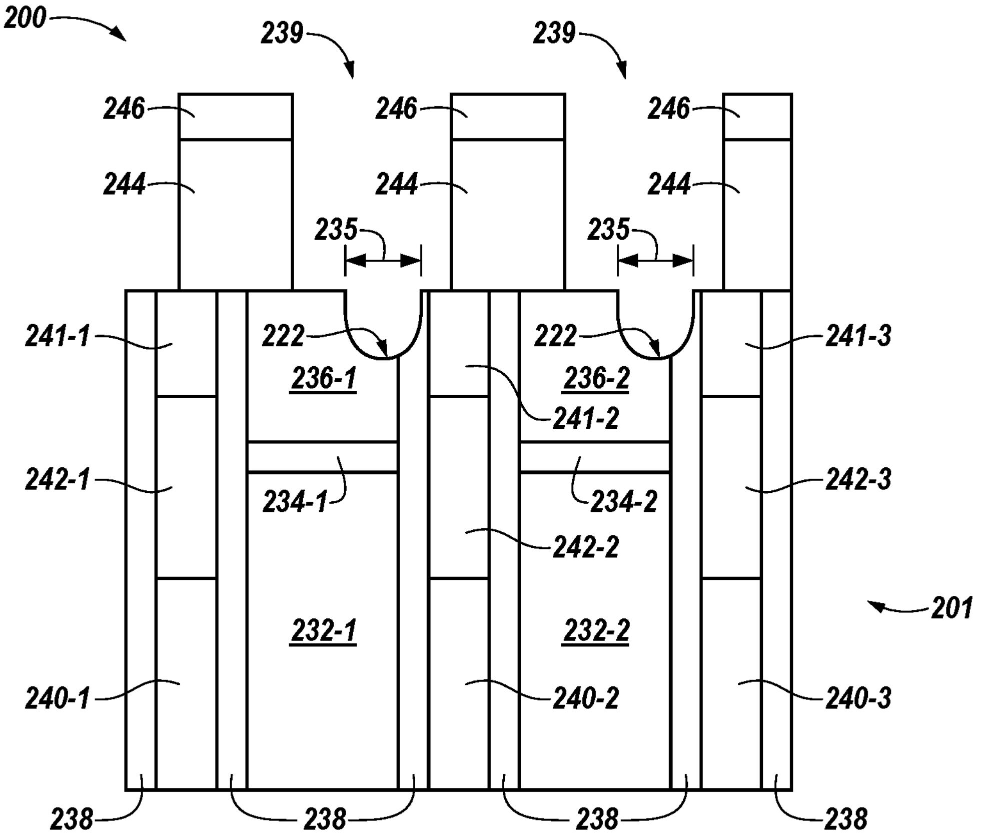

FIG. 2B illustrates a cross-sectional view of a portion of a semiconductor structure 200 of a memory device in association with a semiconductor fabrication sequence formation of a semiconductor structure in accordance with a number of embodiments of the present disclosure. FIG. 2B illustrates the example semiconductor structure at a particular stage following completion of the example fabrication sequence described in connection with FIG. 2A.

In some embodiments, a curved surface (e.g., curved) 222 may be formed on a portion of the first metal material 236 and a portion of the alternating first insulative material 238. The curved surface 222 may be formed on a first side of the first metal material 236 and the adjacent first insulative material 238. That is, the curved surface 222 may be formed in only one of the first insulative material 238 adjacent to the first metal material 236. For example, inside the first vertical opening 239, the curved surface 222 may be etched through a portion of the first metal material 236 and the first insulative material 238 to form a "U" or "C" shaped surface. Multiple first vertical opening 239 may be formed through the carbon-based material 244 and the hard mask 246. The curved surface 222 may be formed within each first vertical opening 239. The curved surface 222 formed in a portion of the first metal material 236 and the first insulative material 238 may have a width greater than 8.0 nanometers (nm). In some embodiments, the curved surface 222 may have a width that is at least 10.5 nm. For example, the curved surface 222 can have a distance 235 end to end of greater than 8.0 nm and up to or greater than 10.5 nm.

According to embodiments, the curved surface 222 may be formed using a metal etch selective to the first metal material 236 and the first insulative material 238. Thus, the metal etch may remove a portion of the first metal material 236 and the first insulative material 238 with minimal or no damage to the first dielectric material 141. Again, according to embodiments, the selected materials, e.g., titanium (Ti), titanium nitride (TiN), ($Ti_2N$), tungsten (W), etc., for the first metal material 236 and the first insulative material 238 with a particular metal etch chemistry and a compatibility to the first dielectric material 241 protects the first dielectric material 241 from damage during the etching of the curved surface 222.

In one embodiment, the wet etch chemistry process may include: nitric acid ($HNO_3$), ammonium hydroxide ($NH_4OH$), hydrogen peroxide ($H_2O_2$), sulfuric acid ($H_2SO_4$), and/or combinations thereof, etc. Embodiments, however, are not so limited. By way of example, a metal etch chemistry mixture of hydrogen fluoride (HF) and water ($H_2O$) may be utilized to etch a portion of the first metal material 236 and the first insulative material 238. According to embodiments, the portion of the first metal material 236 and the first insulative material 238 may be removed in a manner that is less destructive for exposing a contact surface.

Figure 3:
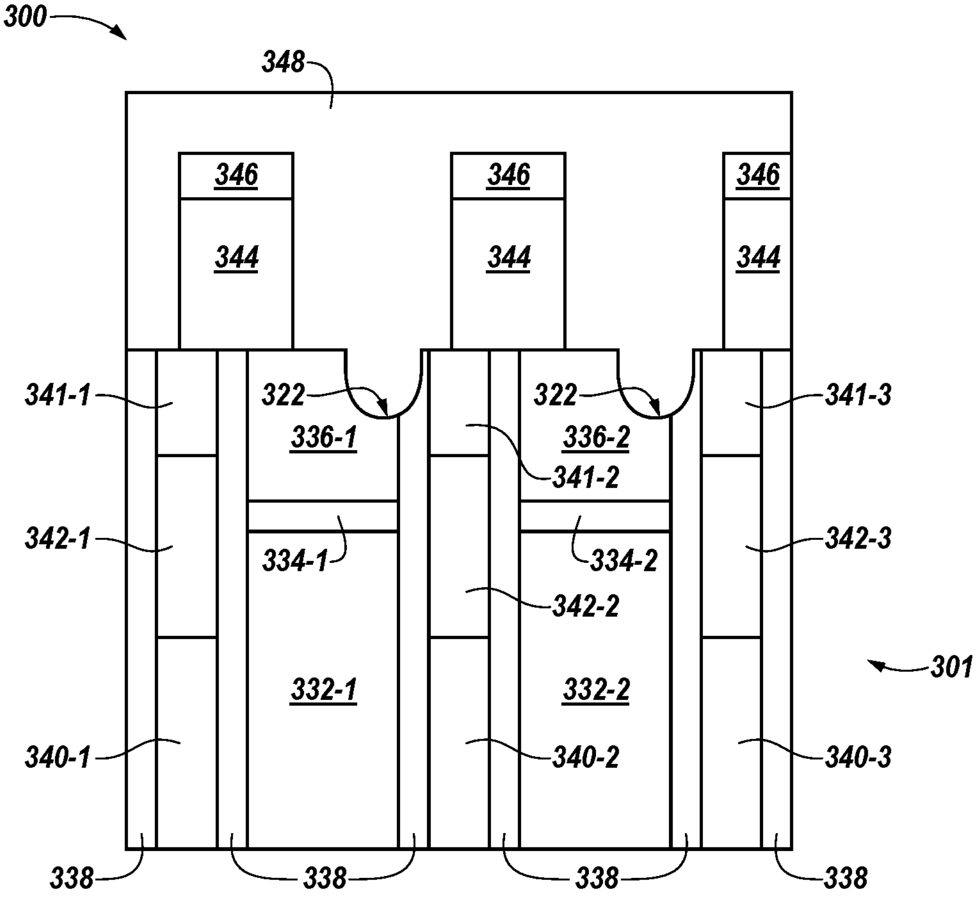

FIG. 3 illustrates a cross-sectional view of a portion of a semiconductor structure 300 of a memory device in association with a semiconductor fabrication sequence formation of a semiconductor structure in accordance with a number of embodiments of the present disclosure. FIG. 3 illustrates the example semiconductor structure at a particular stage following completion of the example fabrication sequence described in connection with FIGS. 2A-2B.

The semiconductor structure 300 may include the same or similar elements as the example semiconductor structure 100 and 200 as referenced in FIGS. 1A-1C and 2A-2B, respectively. For example, the pattern of materials 301 is analogous or similar to pattern of materials 101 and 201. Active areas 332 (individually referring to active area 332-1 and active area 332-2) may be analogous or similar to silicon active areas 132 and 232. First conductive material 334 (individually referring to first conductive material 334-1 and first conductive material 334-2) may be analogous or similar to first conductive material 134 and 234. First metal material 336 (individually referring to first metal material 336-1 and first metal material 336-2) may be analogous or similar to first metal material 136 and 236. Second conductive material 340 (individually referring to second conductive material 340-1 and second conductive material 340-2, and second conductive material 340-3) may be analogous or similar to second conductive material 140 and 240. First dielectric material 341 (individually referring to first dielectric material 341-1 and first dielectric material 341-2, and first dielectric material 341-3) may be analogous or similar to first dielectric material 141 and 241. Third conductive material 342 (individually referring to third conductive material 342-1, third conductive material 342-2, and third conductive material 342-3) may be analogous or similar to third conductive material 142 and 242. First insulative material 338 may be analogous or similar to first insulative material 238. Carbon-based material 344 may be analogous or similar to carbon-based material 144 and 244. Hard mask 346 may be analogous or similar to hard mask 146 and 246.

In some embodiments, an second insulative material 348 may formed in the first vertical opening 239 of FIG. 2B. The second insulative material 348 may cover the exposed sides of the carbon-based material 344 and hard mask 346. The second insulative material 348 may be deposited according to a semiconductor fabrication process such as chemical vapor deposition (CVD), plasma deposition, atomic layer deposition (ALD), etc. Embodiments, however, are not limited to these example and other suitable semiconductor fabrication techniques may be used to deposit the second insulative material 348.

In some embodiments, the second insulative may be an oxide material. For example, the second insulative material 348 may be, but is not limited to, a silicon oxide ($SiO_x$), aluminum oxide ($AlO_x$), gadolinium oxide (GdOx), hafnium oxide (HfOx), magnesium oxide (MgOx), niobium oxide (NbOx), tantalum oxide (TaOx), titanium oxide (TiOx), or a combination of one or more of the listed materials.

Figure 4A:
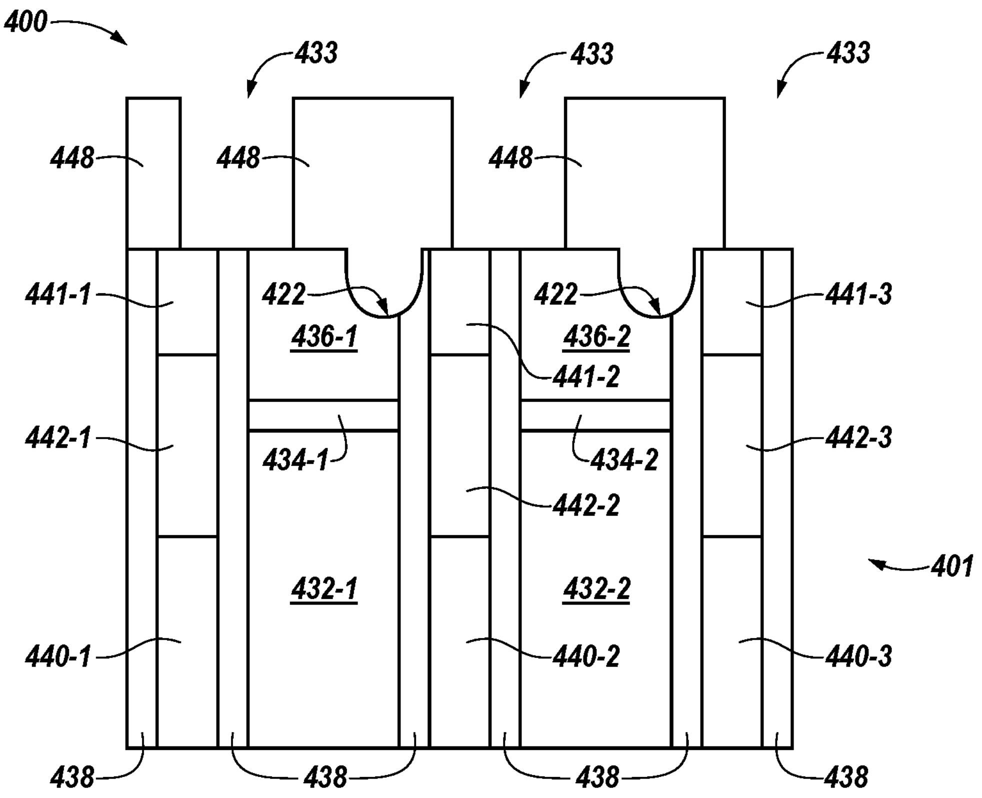

FIG. 4A illustrates a cross-sectional view of a portion of a semiconductor structure 400 of a memory device in association with a semiconductor fabrication sequence formation of a semiconductor structure in accordance with a number of embodiments of the present disclosure. FIG. 4A illustrates the example semiconductor structure at a particular stage following completion of the example fabrication sequence described in connection with FIG. 3.

The semiconductor structure 400 can include the same or similar elements as the example semiconductor structure 100, 200, and 300 as referenced in FIGS. 1A-1C, 2A-2B, and 3, respectively. For example, the pattern of materials 401 is analogous or similar to pattern of materials 101, 201, and 301. Active areas 432 (individually referring to active area 432-1 and active area 432-2) may be analogous or similar to silicon active areas 132, 232, 332. First conductive material 434 (individually referring to first conductive material 434-1 and first conductive material 434-2) may be analogous or similar to first conductive material 134, 234, and 334. First metal material 436 (individually referring to first metal material 436-1 and first metal material 436-2) may be analogous or similar to first metal material 136, 236, and 336. Second conductive material 440 (individually referring to second conductive material 440-1 and second conductive material 440-2, and second conductive material 440-3) may be analogous or similar to second conductive material 140, 240, and 340. First dielectric material 441 (individually referring to first dielectric material 441-1 and first dielectric material 441-2, and first dielectric material 441-3) may be analogous or similar to first dielectric material 141, 241, and 341. Third conductive material 442 (individually referring to conductive 442-1, third conductive material 442-2, and third conductive material 442-3) may be analogous or similar to third conductive material 142, 242, and 342. First insulative material 438 may be analogous or similar to first insulative material 238 and 338.

In some embodiments, the method comprises forming a second vertical opening 433 through a portion of the second insulative material 448, the remaining carbon-based material, 344 of FIG. 3, and the remaining hard mask, 346 of FIG. 3. For example, an etchant process may be used to remover portions of the second insulative material 448, and the remaining portions of the first layer and the hard mask. The second vertical opening 433 may cause the second insulative material 448 to form a plurality of pillar like structures on the pattern of materials 401. The second vertical openings 433 may expose the first surface of the pattern of materials 401.

Figure 4B:
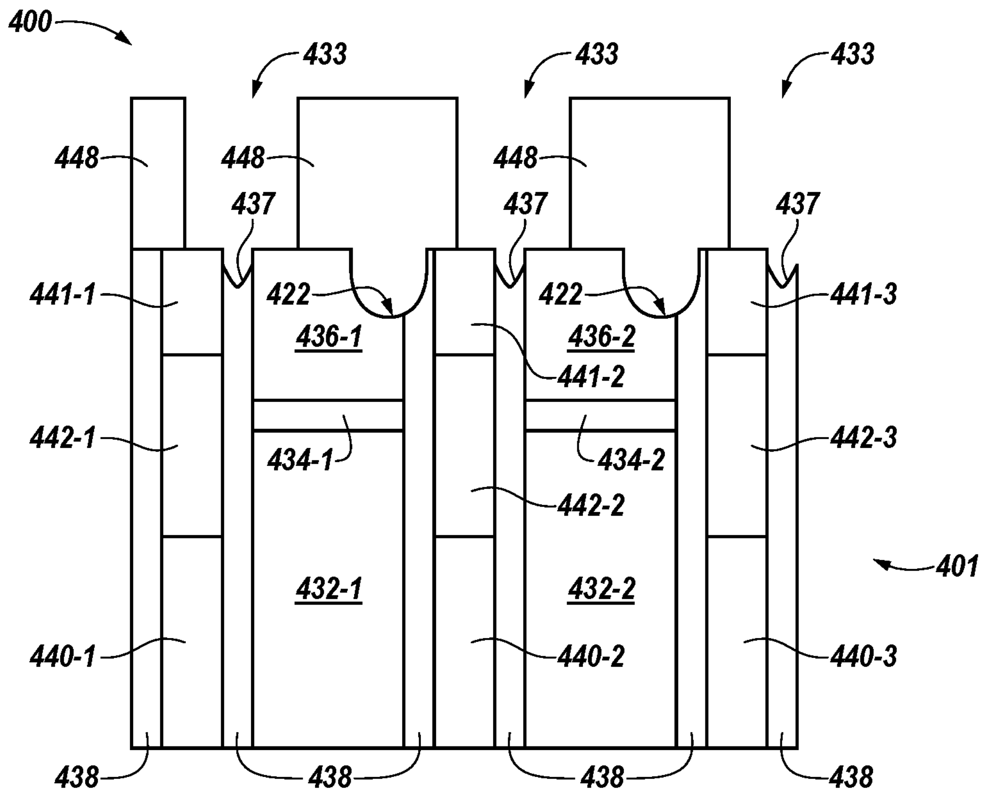

FIG. 4B illustrates a cross-sectional view of a portion of a semiconductor structure 400 of a memory device in association with a semiconductor fabrication sequence formation of a semiconductor structure in accordance with a number of embodiments of the present disclosure. FIG. 4B illustrates the example semiconductor structure at a particular stage following completion of the example fabrication sequence described in connection with FIG. 4A.

In some embodiments, an angled surface 424 may be formed in each first insulative material 438 exposed by the second vertical opening 433. For example, inside the second vertical opening 433, the angled surface 424 may be etched through the first insulative material 438, exposed by the second vertical opening 433, to form a "V" shaped surface. Multiple second vertical openings 433 may be formed to expose the first insulative material 438. The angled surface 424 may be formed within each second vertical opening 433. In some embodiments, the angled surface 424 may be formed in the first insulative material adjacent the second side of the first metal material 436.

According to embodiments, the angled surface 424 may be formed using a wet etch selective to the first insulative material 438. Thus, the wet etch may remove a portion of the first insulative material 438 with minimal or no damage to first metal material 436 and the first dielectric material 441. In some embodiments, the selected materials, e.g., TiN, $Ti_2N$, etc., for the first insulative material 438 with a particular wet etch chemistry and a compatibility to the first dielectric material 441 and first metal material 436 protects the first dielectric material 441 and the first metal material 436 from damage during the etching of the angled surface 424.

In one embodiment, the wet etch chemistry process may include: nitric acid ($HNO_3$), ammonium hydroxide ($NH_4OH$), hydrogen peroxide ($H_2O_2$), sulfuric acid ($H_2SO_4$), and/or combinations thereof, etc. Embodiments, however, are not so limited. According to embodiments, the first insulative material 438 may be removed in a manner that is less destructive for exposing a contact surface.

Figure 5:
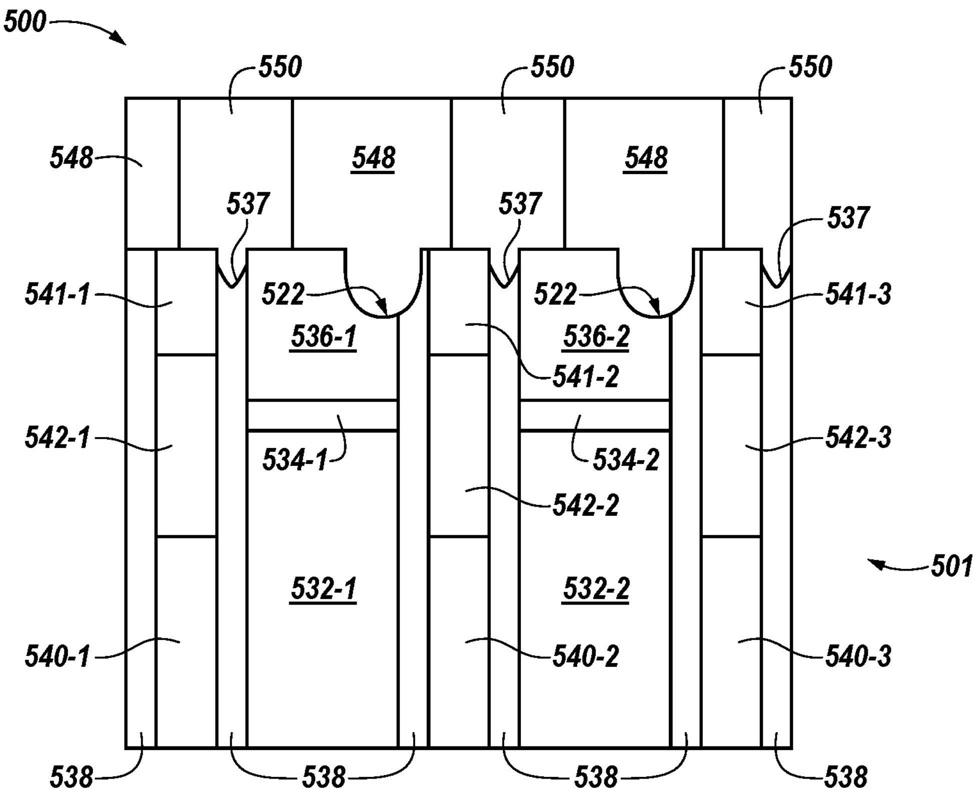

FIG. 5 illustrates a cross-sectional view of a portion of a semiconductor structure 500 of a memory device in association with a semiconductor fabrication sequence formation of a semiconductor structure in accordance with a number of embodiments of the present disclosure. FIG. 5 illustrates the example semiconductor structure at a particular stage following completion of the example fabrication sequence described in connection with FIGS. 4A-4B.

The semiconductor structure 500 can include the same or similar elements as the example semiconductor structure 100, 200, 300 and 400 as referenced in FIGS. 1A-1C, 2A-2B, 3, and 4A-4B, respectively. For example, the pattern of materials 501 is analogous or similar to pattern of materials 101, 201, 301 and 401. Active areas 532 (individually referring to active area 532-1 and active area 532-2) may be analogous or similar to silicon active areas 132, 232, 332, and 432. First conductive material 534 (individually referring to first conductive material 534-1 and first conductive material 534-2) may be analogous or similar to first conductive material 134, 234, 334, and 434. First metal material 536 (individually referring to first metal material 536-1 and first metal material 536-2) may be analogous or similar to first metal material 136, 236, 336, and 436. Second conductive material 540 (individually referring to second conductive material 540-1 and second conductive material 540-2, and second conductive material 540-3) may be analogous or similar to second conductive material 140, 240, 340, and 440. First dielectric material 541 (individually referring to first dielectric material 541-1 and first dielectric material 541-2, and first dielectric material 541-3) may be analogous or similar to first dielectric material 141, 241, 341, and 441. Third conductive material 542 (individually referring to conductive 542-1, third conductive material 542-2, and third conductive material 542-3) may be analogous or similar to third conductive material 142, 242, 342, and 442. First insulative material 538 may be analogous or similar to first insulative material 238, 338, and 438.

In some embodiments, a second metal material 550 may formed in the second vertical opening 433 of FIG. 4B. The second metal material 550 may fill the angled surface 437 of FIG. 4B when deposited in the second vertical opening. The second metal material 550 may be deposited according to a semiconductor fabrication process such as chemical vapor deposition (CVD), plasma deposition, atomic layer deposition (ALD), etc. Embodiments, however, are not limited to these example and other suitable semiconductor fabrication techniques may be used to deposit the second insulative material 548. In some embodiments, the second metal material 550 may include, but is not limited to, tungsten (W), titanium (Ti), or a tungsten titanium polymer, among other possibilities. In some embodiments, the second metal material 550 and the first metal material 536 may be the same material.

Figure 6:
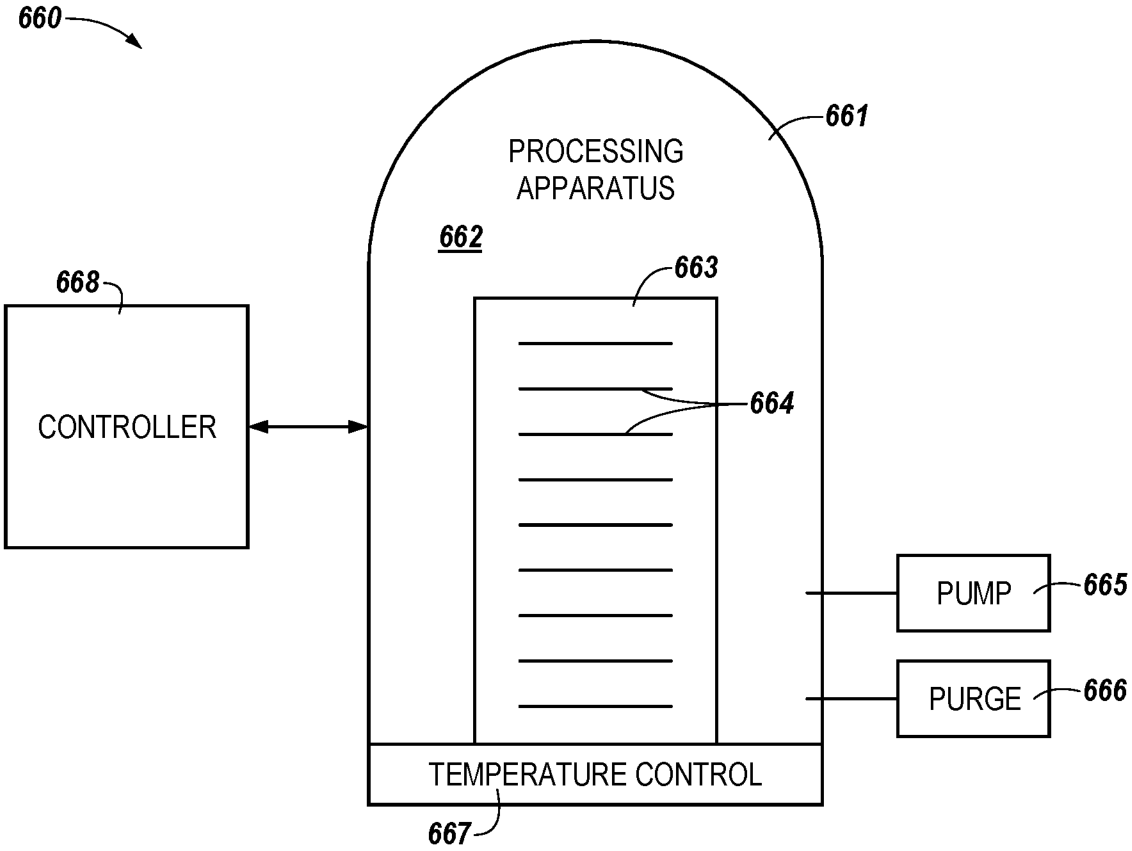
FIG. 6 is a functional block diagram of a system for implementation of an example semiconductor fabrication process in accordance with a number of embodiments of the present disclosure.

FIG. 6 is a functional block diagram of a system 660 for implementation of an example semiconductor fabrication process in accordance with a number of embodiments of the present disclosure. The system 660 can include a processing apparatus 661. The processing apparatus 661 can be configured to enable depositing a storage node material.

The processing apparatus 661 can include a semiconductor processing chamber 662 to enclose components configured to deposit a storage node material. The chamber 662 can further enclose a carrier 663 to hold a batch of semiconductor wafers 664. The processing apparatus 661 can include and/or be associated with tools including, for example, a pump 665 unit and a purge 666 unit configured to introduce and remove reactants. In one example, the reactants may include precursors/reducing agents. The processing apparatus 661 can further include a temperature control 667 unit configured to maintain the chamber 662 at appropriate temperatures as described herein.

The system 660 can further include a controller 668. The controller 668 can include, or be associated with, circuitry and/or programming for implementation of, for instance, depositing a storage node material. Adjustment of such deposition and purging operations by the controller 668 can control the thickness of the materials described herein.

The controller 668 can, in a number of embodiments, be configured to use hardware as control circuitry. Such control circuitry may, for example, be an application specific integrated circuit (ASIC) with logic to control fabrication steps, via associated deposition and purge processes, for depositing a storage node material.

Figure 7:
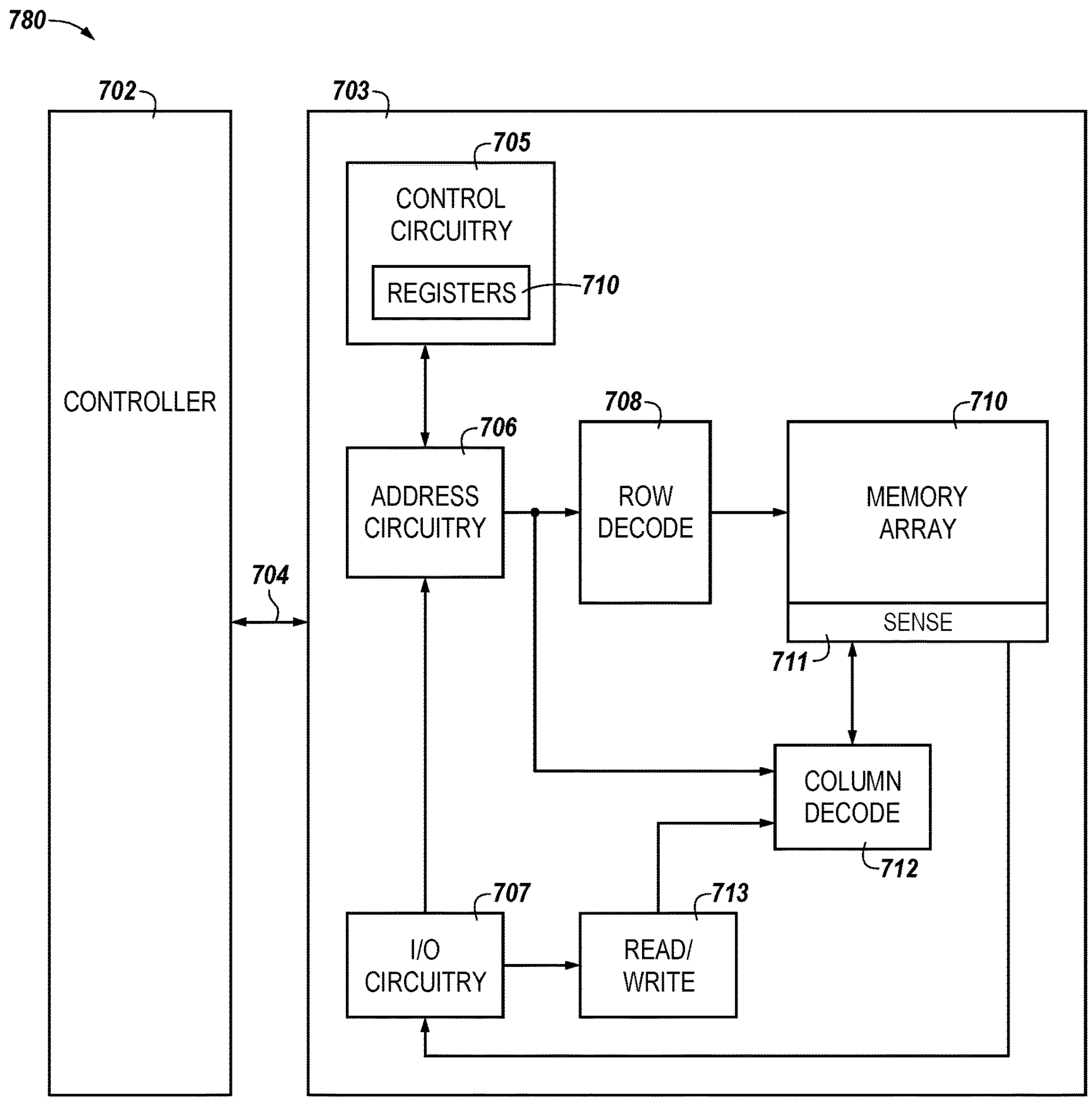
FIG. 7 illustrates a functional block diagram of an apparatus in the form of a computing system including a semiconductor structure of a memory system in accordance with a number of embodiments of the present disclosure

FIG. 7 is a block diagram of an apparatus in the form of a computing system 780 including a memory device 703 in accordance with a number of embodiments of the present disclosure. As used herein, a memory device 703, a memory array 710, and/or a host 702, for example, might also be separately considered an "apparatus." According to embodiments, the memory device 703 may comprise at least one memory array 710 with a memory cell formed having a digit line and body contact, according to the embodiments described herein.

In this example, system 780 includes a host 702 coupled to memory device 703 via an interface 704. The computing system 780 can be a personal laptop computer, a desktop computer, a digital camera, a mobile telephone, a memory card reader, or an Internet-of-Things (IOT) enabled device, among various other types of systems. Host 702 can include a number of processing resources (e.g., one or more processors, microprocessors, or some other type of controlling circuitry) capable of accessing memory 703. The system 780 can include separate integrated circuits, or both the host 702 and the memory device 703 can be on the same integrated circuit. For example, the host 702 may be a system controller of a memory system comprising multiple memory devices 703, with the system controller 705 providing access to the respective memory devices 703 by another processing resource such as a central processing unit (CPU).

In the example shown in FIG. 7, the host 702 is responsible for executing an operating system (OS) and/or various applications (e.g., processes) that can be loaded thereto (e.g., from memory device 703 via controller 705). The OS and/or various applications can be loaded from the memory device 703 by providing access commands from the host 702 to the memory device 703 to access the data comprising the OS and/or the various applications. The host 702 can also access data utilized by the OS and/or various applications by providing access commands to the memory device 703 to retrieve said data utilized in the execution of the OS and/or the various applications.

For clarity, the system 780 has been simplified to focus on features with particular relevance to the present disclosure. The memory array 710 can be a DRAM array comprising at least one memory cell having a digit line and body contact formed according to the techniques described herein. For example, the memory array 710 can be a 4F2 array. The array 710 can comprise memory cells arranged in columns coupled by word lines (which may be referred to herein as access lines or select lines) and rows coupled by digit lines (which may be referred to herein as sense lines or data lines). Although a single array 710 is shown in FIG. 7, embodiments are not so limited. For instance, memory device 703 may include a number of arrays 710 (e.g., a number of banks of DRAM cells).

The memory device 703 includes address circuitry 706 to latch address signals provided over an interface 704. The interface can include, for example, a physical interface employing a suitable protocol (e.g., a data bus, an address bus, and a command bus, or a combined data/address/command bus). Such protocol may be custom or proprietary, or the interface 704 may employ a standardized protocol, such as Peripheral Component Interconnect Express (PCIe), Gen-Z, CCIX, or the like. Address signals are received and decoded by a row decoder 708 and a column decoder 712 to access the memory array 710. Data can be read from memory array 710 by sensing voltage and/or current changes on the sense lines using sensing circuitry 711. The sensing circuitry 711 can comprise, for example, sense amplifiers that can read and latch a page (e.g., row) of data from the memory array 710. The I/O circuitry 707 can be used for bi-directional data communication with the host 702 over the interface 704. The read/write circuitry 713 is used to write data to the memory array 710 or read data from the memory array 710. As an example, the circuitry 713 can comprise various drivers, latch circuitry, etc.

Control circuitry 705 decodes signals provided by the host 702. The signals can be commands provided by the host 702. These signals can include chip enable signals, write enable signals, and address latch signals that are used to control operations performed on the memory array 710, including data read operations, data write operations, and data erase operations. In various embodiments, the control circuitry 705 is responsible for executing instructions from the host 702. The control circuitry 705 can comprise a state machine, registers 710, a sequencer, and/or some other type of control circuitry, which may be implemented in the form of hardware, firmware, or software, or any combination of the three. In some examples, the host 702 can be a controller external to the memory device 703. For example, the host 702 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

In the above detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

It is to be understood that the terminology used herein is for the purpose of describing particular examples only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example examples including various combinations and configurations of semiconductor materials, underlying materials, structural materials, dielectric materials, capacitor materials, working surface materials, silicate materials, nitride materials, buffer materials, etch chemistries, etch processes, solvents, memory devices, memory cells, sidewalls of openings and/or trenches, among other materials and/or components related to stacking a semiconductor structure have been illustrated and described herein, examples of the present disclosure are not limited to those combinations explicitly recited herein. Other combinations and configurations of the semiconductor materials, underlying materials, structural materials, dielectric materials, capacitor materials, substrate materials, working surfaces, silicate materials, nitride materials, buffer materials, etch chemistries, etch processes, solvents, memory devices, memory cells, sidewalls of openings and/or trenches related to stacking a semiconductor structure than those disclosed herein are expressly included within the scope of this disclosure.

Although specific examples have been illustrated and described herein, those of ordinary skill in the art will appreciate that an arrangement calculated to achieve the same results may be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and processes are used. Therefore, the scope of one or more examples of the present disclosure should be determined with reference to the appended claims, along with the full range of equivalents to which such claims are entitled.

In the foregoing Detailed Description, some features are grouped together in an example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a disclosed example. Thus, the following claims are hereby incorporated into the Detailed Description, with each claim standing on its own as a separate example.

What is claimed is:

1. A semiconductor structure, comprising:

a patterned material comprising:

a plurality of active areas;

a first conductive material on a surface of each of the plurality of active areas;

a first metal material on a surface of each first conductive materials;

a second conductive material, a third conductive material formed on the second conductive material along a first direction, and a first dielectric material formed on the third conductive material along the first direction, wherein the third conductive material is a digit line material;

a first insulative material formed adjacent to a vertical boundary comprising the first metal material, the second conductive material, and the third conductive material along a second direction, wherein the first insulative material separates, along the second direction each active area of the active areas, the first conductive material, and the first metal material from each of the second conductive material, the third conductive material, and the first dielectric material;

a curved surface extending, along the second direction, from an intermediate portion of a first side of the first metal material to and an intermediate portion of the first insulative material along the first direction; and a second insulative material and a second metal material on the surface of the patterned material, wherein a portion of the second insulative material is in contact with the curved surface, and wherein the second insulative material is different from the first insulative material.

2. The semiconductor structure of claim 1, comprising an angled surface formed in each first insulative material on a second side of the first metal material.

3. The semiconductor structure of claim 2, wherein the second metal material is in contact with the angled surface formed in each first insulative material on the second side of the first metal material.

4. The semiconductor structure of claim 1, wherein the curved surface has a width that is greater than 8.0 nanometers (nm).

5. The semiconductor structure of claim 1, wherein the first metal material is a titanium nitride material.

6. The semiconductor structure of claim 1, wherein the second conductive material serves as an isolation material.

7. The semiconductor structure of claim 1, wherein the first insulative material is a nitride material.

8. The semiconductor structure of claim 1, wherein the second insulative material is an oxide material.

9. The semiconductor structure of claim 1, wherein the active area of the active areas is a silicon-based material.

* * * * *